United States Patent
Ando et al.

(10) Patent No.: US 8,420,502 B2
(45) Date of Patent: Apr. 16, 2013

(54) GROUP III-V SEMICONDUCTOR DEVICE AND METHOD FOR PRODUCING THE SAME

(75) Inventors: Masanobu Ando, Aichi-ken (JP); Shigemi Horiuchi, Aichi-ken (JP); Yoshinori Kinoshita, Aichi-ken (JP); Kazuyoshi Tomita, Nagoya (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 293 days.

(21) Appl. No.: 12/656,970

(22) Filed: Feb. 22, 2010

(65) Prior Publication Data

US 2010/0151612 A1 Jun. 17, 2010

Related U.S. Application Data

(62) Division of application No. 12/076,234, filed on Mar. 14, 2008, now abandoned.

(30) Foreign Application Priority Data

Mar. 16, 2007 (JP) ................................ 2007-069266

(51) Int. Cl.
*H01L 21/20* (2006.01)
*H01L 21/18* (2006.01)

(52) U.S. Cl.
USPC .......... 438/458; 438/22; 438/26; 438/40; 438/45; 438/299; 438/455; 385/129; 385/130; 372/39; 372/43.01; 313/498; 205/640; 156/235; 257/79; 257/94; 257/98

(58) Field of Classification Search ............ 257/88, 257/E33.023, E33.06; 438/22, 24, 26, 28, 438/29, 978
See application file for complete search history.

(56) References Cited

U.S. PATENT DOCUMENTS

| | | | | |
|---|---|---|---|---|
| 4,966,862 A | * | 10/1990 | Edmond | 438/27 |
| 5,753,558 A | * | 5/1998 | Akram et al. | 438/386 |
| 6,303,463 B1 | * | 10/2001 | Tanaka | 438/414 |
| 6,335,263 B1 | * | 1/2002 | Cheung et al. | 438/455 |
| 6,404,125 B1 | * | 6/2002 | Garbuzov et al. | 313/499 |

(Continued)

FOREIGN PATENT DOCUMENTS

| | | |
|---|---|---|
| JP | 9-162441 | 6/1997 |
| JP | 2001-210914 | 8/2001 |

(Continued)

OTHER PUBLICATIONS

Japanese Office Action dated Oct. 31, 2008, with English language translation.

*Primary Examiner* — Matthew W Such
*Assistant Examiner* — William Harriston
(74) *Attorney, Agent, or Firm* — McGinn IP Law Group, PLLC

(57) ABSTRACT

A method for producing a Group III-V semiconductor device, includes forming, on a base, a plurality of semiconductor devices isolated from one another, forming, through ion implantation, a high-resistance region in a surface layer of a side surface of each semiconductor device, after formation of the high-resistance region, forming a p-electrode and a low-melting-point metal diffusion prevention layer on the top surface of the semiconductor device, bonding the semiconductor device to a conductive support substrate via a low-melting-point metal layer, and removing the base through the laser lift-off process.

19 Claims, 11 Drawing Sheets

U.S. PATENT DOCUMENTS

| | | | |
|---|---|---|---|
| 6,680,963 B2* | 1/2004 | Liao et al. | 372/96 |
| 6,855,958 B2* | 2/2005 | Sato et al. | 257/79 |
| 7,008,810 B2* | 3/2006 | Hoss et al. | 438/39 |
| 7,183,183 B2* | 2/2007 | Duerksen et al. | 438/524 |
| 7,208,337 B2* | 4/2007 | Eisert et al. | 438/42 |
| 7,268,371 B2* | 9/2007 | Krames et al. | 257/98 |
| 7,402,837 B2* | 7/2008 | Slater et al. | 257/91 |
| 7,446,344 B2* | 11/2008 | Fehrer et al. | 257/95 |
| 7,531,392 B2* | 5/2009 | Ellis-Monaghan et al. | 438/150 |
| 7,563,625 B2* | 7/2009 | Tran et al. | 438/29 |
| 7,902,038 B2* | 3/2011 | Aspar et al. | 438/455 |
| 8,004,006 B2* | 8/2011 | Nakahara et al. | 257/99 |
| 8,142,593 B2* | 3/2012 | Deguet et al. | 156/235 |
| 8,193,069 B2* | 6/2012 | Moriceau et al. | 438/455 |
| 8,193,562 B2* | 6/2012 | Suh et al. | 257/194 |
| 8,278,668 B2* | 10/2012 | Kim | 257/79 |
| 2002/0048837 A1* | 4/2002 | Burke et al. | 438/48 |
| 2002/0070125 A1* | 6/2002 | Ng et al. | 205/640 |
| 2002/0179910 A1* | 12/2002 | Slater, Jr. | 257/77 |
| 2003/0021317 A1* | 1/2003 | Liao et al. | 372/46 |
| 2004/0023468 A1* | 2/2004 | Ghyselen et al. | 438/455 |
| 2004/0061433 A1 | 4/2004 | Izuno et al. | |
| 2005/0002630 A1* | 1/2005 | Salib et al. | 385/129 |
| 2005/0130390 A1* | 6/2005 | Andrews et al. | 438/458 |
| 2005/0145869 A1* | 7/2005 | Slater et al. | 257/99 |
| 2005/0186757 A1* | 8/2005 | Wu et al. | 438/455 |
| 2005/0194584 A1 | 9/2005 | Slater et al. | |
| 2005/0199885 A1 | 9/2005 | Hata et al. | |
| 2005/0247950 A1* | 11/2005 | Nakamura et al. | 257/98 |
| 2005/0253203 A1* | 11/2005 | Liaw | 257/397 |
| 2005/0280352 A1* | 12/2005 | Lai | 313/498 |
| 2005/0285126 A1* | 12/2005 | Wu et al. | 257/94 |
| 2006/0051937 A1* | 3/2006 | Ploessl et al. | 438/459 |
| 2006/0060868 A1* | 3/2006 | Orita | 257/84 |
| 2006/0065901 A1* | 3/2006 | Aoyagi et al. | 257/79 |
| 2006/0065905 A1* | 3/2006 | Eisert et al. | 257/95 |
| 2006/0097274 A1* | 5/2006 | Lee et al. | 257/98 |
| 2006/0249797 A1* | 11/2006 | Nakazawa et al. | 257/378 |
| 2007/0096130 A1* | 5/2007 | Schiaffino et al. | 257/98 |
| 2007/0164298 A1* | 7/2007 | Kim et al. | 257/94 |
| 2007/0166851 A1* | 7/2007 | Tran et al. | 438/22 |
| 2007/0170445 A1* | 7/2007 | Furukawa et al. | 257/94 |
| 2007/0184621 A1* | 8/2007 | Chidambarrao et al. | 438/299 |
| 2007/0252165 A1* | 11/2007 | Jang et al. | 257/98 |
| 2007/0295952 A1* | 12/2007 | Jang et al. | 257/15 |
| 2008/0149953 A1* | 6/2008 | Ando et al. | 257/94 |
| 2008/0211055 A1* | 9/2008 | Assefa et al. | 257/506 |
| 2008/0224158 A1* | 9/2008 | Sun | 257/98 |
| 2009/0017566 A1* | 1/2009 | Basin et al. | 438/26 |
| 2009/0267096 A1* | 10/2009 | Kim | 257/98 |
| 2010/0155765 A1* | 6/2010 | Jang et al. | 257/98 |
| 2010/0193842 A1* | 8/2010 | Sato et al. | 257/200 |
| 2012/0187440 A1* | 7/2012 | Kim | 257/98 |

FOREIGN PATENT DOCUMENTS

| | | |
|---|---|---|
| JP | 2004-95640 | 3/2004 |
| JP | 2005-522873 | 7/2005 |
| JP | 2005-259768 | 9/2005 |
| JP | 2005-333130 | 12/2005 |
| JP | 2006-86361 | 3/2006 |
| JP | 2006-135321 | 5/2006 |
| JP | 2006-261179 | 9/2006 |

* cited by examiner

GROUP III-V SEMICONDUCTOR DEVICE AND METHOD FOR PRODUCING THE SAME

The present Application is a Divisional Application of U.S. patent application Ser. No. 12/076,234, filed on Mar. 14, 2008 now abandoned, which is based on and claims priority from Japanese Patent Application No. 2007-069266, filed on Mar. 16, 2007, the entire contents of which are incorporated herein by reference.

BACKGROUND OF THE INVENTION

1. Field of the Invention

The present invention relates to a method for producing a semiconductor device which method includes growing an n-layer and a p-layer of a group III-V semiconductor on a growth substrate, bonding an electrode layer on the p-layer to a support substrate by use of solder, and removing the growth substrate through the laser lift-off process; and to a semiconductor device produced through the method. More particularly, the present invention relates to a method for producing a semiconductor device so as to prevent short circuit between side surfaces of a p-layer and an n-layer, and to a semiconductor device structure produced through the method.

2. Background Art

In general, sapphire, which is chemically and thermally stable, has been employed as a substrate for the growth of a group III nitride semiconductor. However, since sapphire has no electrical conductivity, current cannot flow in a vertical direction of a semiconductor stacked structure including a sapphire substrate. Furthermore, sapphire has no clear cleavage plane, making dicing of a semiconductor structure on a sapphire substrate difficult. In addition, sapphire exhibits low thermal conductivity, and inhibits radiation of heat from a semiconductor device. In a semiconductor device including a semiconductor layer and a sapphire substrate, external quantum efficiency is low due to total reflection at the interface between the semiconductor layer and the substrate, or confinement of light in the semiconductor layer. Meanwhile, one conceivable technique for improving light extraction efficiency is forming irregularities on a light extraction surface. However, a sapphire substrate encounters difficulty in such a processing.

One technique known to solve such a problem is the laser lift-off process, which is used for separation and removal of a sapphire substrate through laser beam radiation.

Japanese Patent Application Laid-Open (kokai) No. 2005-333130 discloses a method in which a group 111 nitride semiconductor device is formed on a sapphire substrate; grooves are formed in the device through etching for separating the device region into chips; each chip is provided with electrodes; and each group III nitride semiconductor device grown on the sapphire substrate is bonded to a support substrate, followed by the laser lift-off process. Japanese Patent Application Laid-Open (kokai) No. 2005-333130 describes that cracking in the group III nitride semiconductor device— which would otherwise be caused by thermal expansion of gas remaining in the grooves through laser beam radiation— can be prevented by filling the grooves with a dielectric material for elimination of gas.

Japanese Kohyo Patent Publication No. 2005-522873 discloses a method in which grooves are filled with a photoresist; and, instead of bonding between a group III nitride semiconductor device and a support substrate, a metal layer is formed on the group III nitride semiconductor device, followed by the laser lift-off process. This patent document describes that grooves are filled with a photoresist for the purpose of preventing a metal from entering the grooves during formation of a layer of the metal.

Japanese Patent Application Laid-Open (kokai) No. 2006-135321 discloses a method in which a protective film of, for example, $SiO_2$ or $Al_2O_3$, and a seed metal film are formed on inclined side surfaces of a semiconductor device; and a metal layer is formed on grooves and the semiconductor device, followed by the laser lift-off process.

Meanwhile, Japanese Patent Application Laid-Open (kokai) Nos. 2004-95640 and 2006-261179 disclose a semiconductor device having a high-resistance device-isolating area, which is formed through ion implantation into a Group III nitride semiconductor.

When the method disclosed in Japanese Kohyo Patent Publication No. 2005-522873 is employed, resist remains in a Group III nitride semiconductor light-emitting device after the lift-off process. Therefore, such a device may have poor reliability after a subsequent mounting step including a high-temperature treatment (e.g., reflowing).

The method disclosed in Japanese Patent Application Laid-Open (kokai) No. 2006-135321 poses a problem in that, since a sapphire substrate (growth substrate) and a protective film are strongly bonded to each other, exfoliation occurs in the protective film during separation of the sapphire substrate, leading to cracking in a semiconductor device. This method also poses a problem in that a metal layer formed on the semiconductor device must be cut during dicing.

In the method disclosed in Japanese Patent Application Laid-Open (kokai) No. 2005-333130, since electrodes are formed before the grooves are filled with a dielectric material, a metal element constituting the electrodes may be deposited on a side surface of a semiconductor device, resulting in current leakage or short circuit. In addition, the formed dielectric film may be mechanically damaged during the laser lift-off process.

SUMMARY OF THE INVENTION

In view of the foregoing, an object of the present invention is to realize a Group III-V semiconductor device of a new structure, which device is bonded to a conductive support substrate and in which current leakage or short circuit is prevented at a side surface of the device. Another object of the invention is to provide a method for producing the semiconductor device.

Accordingly, in a first aspect of the present invention, there is provided a Group III-V semiconductor device bonded to a conductive support substrate, which device has a side surface whose surface layer has a high-resistance region formed through ion implantation.

No particular limitation is imposed on the atomic species used in ion implantation, and any atoms may be implanted, so long as the atoms are difficult to electrically activate. Examples of such atoms include nitrogen, arsenic, and phosphorus. The implanted ion concentration of the high-resistance region is preferably $1\times10^{18}$ to $1\times10^{22}/cm^3$. When the concentration is lower than $1\times10^{18}/cm^3$, high resistance cannot be attained, whereas when the concentration is higher than $1\times10^{22}/cm^3$, crystallinity of the semiconductor is excessively impaired. Needless to say, both cases are not preferred.

The support substrate and the semiconductor device may be bonded to each other by means of a low-melting-point metal layer formed of a eutectic metal layer (e.g., an Au—Sn layer, an Au—Si layer, an Ag—Sn—Cu layer, or an Sn—Bi layer); or by means of a non-solder layer of Au, Sn, or Cu (although such a metal is not a low-melting-point metal).

The support substrate is formed of a conductive substrate such as an Si substrate, a GaAs substrate, a Cu substrate, or a Cu—W substrate. The support substrate may be formed through directly plating a semiconductor device with a metal such as Cu.

A second aspect of the present invention is drawn to a specific embodiment of the semiconductor device according to the first aspect, wherein the semiconductor device is bonded to the support substrate by means of a low-melting-point metal layer.

A third aspect of the present invention is drawn to a specific embodiment of the semiconductor device according to the second aspect, wherein the low-melting-point metal layer comprises at least one selected from a group consisting of Au—Sn, Au—Si, Ag—Sn—Cu, and Sn—Bi.

A fourth aspect of the present invention is drawn to a specific embodiment of the semiconductor device according to the first aspect, wherein the semiconductor device is bonded to the support substrate by means of a non-solder layer.

A fifth aspect of the present invention is drawn to a specific embodiment of the semiconductor device according to the fourth aspect, wherein the non-solder layer comprises at least one selected from a group consisting of Au, Sn, and Cu.

A sixth aspect of the present invention is drawn to a specific embodiment of the semiconductor device according to any of the first to fifth aspects, wherein the semiconductor device is formed into an inverted tapered structure in which the device has a cross-sectional area gradually decreasing toward the support substrate.

A seventh aspect of the present invention is drawn to a specific embodiment of the semiconductor device according to any of the first to fifth aspects, wherein the semiconductor device has a p-electrode bonded to the support substrate, and the p-electrode is formed on the entire top surface of the support substrate.

The p-electrode is preferably made of a metal having high optical reflectance and low contact resistance; for example, Ag, Rh, Pt, Ru, or an alloy containing such a metal as a primary component. Alternatively, the p-electrode may be made of, for example, Ni, an Ni alloy, or an Au alloy; or may be formed of a composite layer including a transparent electrode film (e.g., ITO film) and a highly reflective metal film.

An eighth aspect of the present invention is drawn to a specific embodiment of the semiconductor device according to any of the first to sixth aspects, wherein the semiconductor has a top surface whose surface layer has, at least in the vicinity of the side surface, a high-resistance region formed through ion implantation.

A ninth aspect of the present invention is drawn to a specific embodiment of the semiconductor device according to any of the first to sixth aspects, wherein the semiconductor has a top surface having thereon, at least in the vicinity of the side surface, an insulating film formed of a dielectric material.

In the eighth and ninth aspects of the invention, the top surface of a semiconductor device refers to a surface of the semiconductor device opposite the surface which is bonded to the support substrate. When the semiconductor device is a Group III nitride semiconductor device, the top surface is generally an n-layer surface, which serves as a light extraction surface when the device is a light-emitting device. The expression "in the vicinity of a side surface" refers to a portion of the top surface extending from the side surface to the inside and having a width 5% to 10% the width of the top surface. The high-resistance region or insulating film may be formed on the entire top surface of the semiconductor device other than the electrode-forming region(s).

A tenth aspect of the present invention is drawn to a specific embodiment of the semiconductor device according to any of the first to ninth aspects, wherein the support substrate is formed through plating.

An eleventh aspect of the present invention is drawn to a specific embodiment of the semiconductor device according to any of the first to tenth aspects, wherein the semiconductor device is a Group III nitride semiconductor device.

A twelfth aspect of the present invention is drawn to a specific embodiment of the semiconductor device according to any of the first to eleventh aspects, wherein the semiconductor device is a light-emitting device.

In a thirteenth aspect of the present invention, there is provided a method for producing a Group III-V semiconductor device, the method comprising:

forming, on a base, a plurality of semiconductor devices isolated from one another;

forming, through ion implantation, a high-resistance region in a surface layer of a side surface of each semiconductor device;

after formation of the high-resistance region, forming a p-electrode and a low-melting-point metal diffusion prevention layer on the top surface of the semiconductor device;

bonding the semiconductor device to a conductive support substrate via a low-melting-point metal layer; and removing the base through the laser lift-off process.

The low-melting-point metal diffusion prevention layer may be formed of, for example, a Ti/Ni-containing multilayer film (e.g., Ti/Ni/Au film), or a W/Pt-containing multilayer film (e.g., W/Pt/Au film), and is provided for preventing diffusion therethrough of a metal constituting the low-melting-point metal layer. The low-melting-point metal diffusion prevention layer also prevents diffusion of an electrode material such as a metal of high optical reflectance (e.g., Ag).

The step of forming a plurality of semiconductor devices isolated from one another does not mean that the semiconductor devices are isolated with a base, but means that the semiconductor layer is divided into semiconductor device regions which are on a non-isolated, single base. For example, a semiconductor layer is epitaxially grown on a base, and a predetermined region of the layer is dry-etched. The p-electrode and low-melting-point metal diffusion prevention layer may be formed through the lift-off process.

The ion implantation dose is preferably $1 \times 10^{10}$ to $1 \times 10^{18}/cm^2$. When the dose falls within this range, the implanted ion concentration of the high-resistance region can be adjusted to $1 \times 10^{18}$ to $1 \times 10^{22}/cm^3$.

In the laser-lift-off process, a base is irradiated with a laser beam, to thereby melt the bonding interface between the base and the semiconductor layer, followed by removing the base.

A fourteenth aspect of the present invention is drawn to a specific embodiment of the production method according to the thirteenth aspect, wherein the side surface of the semiconductor device is formed to be inclined so that the device has a cross-sectional area gradually increasing toward the base, and ion implantation is performed along a direction normal to the main plane of the base.

A fifteenth aspect of the present invention is drawn to a specific embodiment of the production method according to the thirteenth or fourteenth aspect, wherein ion implantation is performed along a direction normal to the main plane of the base at an acceleration voltage which allows the implanted ions to reach the base.

A sixteenth aspect of the present invention is drawn to a specific embodiment of the production method according to the thirteenth or fourteenth aspect, wherein the method includes, after removal of the base, performing ion implantation into a portion of the surface of the semiconductor device which surface has previously bonded to the base, the portion being in the vicinity of the side surface.

A seventeenth of the present invention is drawn to a specific embodiment of the production method according to the thirteenth or fourteenth aspect, wherein the method includes, after removal of the base, forming an n-electrode on the surface of the semiconductor device which surface has previously bonded to the base, and performing ion implantation into the surface of the semiconductor device through the n-electrode, which serves as a mask.

An eighteenth aspect of the present invention is drawn to a specific embodiment of the production method according to the thirteenth or fourteenth aspect, wherein the method includes, after removal of the base, forming a dielectric material insulating film on a portion of the surface of the semiconductor device which surface has previously bonded to the base, the portion being in the vicinity of the side surface.

In a nineteenth aspect of the present invention, there is provided a method for producing a Group III-V semiconductor device, the method comprising:

forming a Group III-V semiconductor layer on a base;

forming a high-resistance region in a surface layer of a predetermined portion of the top surface of the semiconductor layer through ion implantation at an acceleration voltage which allows the implanted ions to reach the base;

dividing the semiconductor layer, through the high-resistance region, into semiconductor devices isolated from one another;

after formation of the high-resistance region, forming a p-electrode and a low-melting-point metal diffusion prevention layer on the top surface of each semiconductor device;

bonding the semiconductor device to a conductive support substrate via a low-melting-point metal layer; and removing the base through the laser lift-off process.

The p-electrode and low-melting-point metal diffusion prevention layer may be formed solely on the top surface of each semiconductor device, or may be formed on the entire semiconductor layer without being patterned.

A twentieth aspect of the present invention is drawn to a specific embodiment of the production method according to the fifteenth or nineteenth aspect, wherein ion implantation is performed at a plurality of times at different acceleration voltages.

In a twenty-first aspect of the present invention, there is provided a method for producing a Group III-V semiconductor device, the method comprising:

forming a Group III-V semiconductor layer on a base;

forming a first high-resistance region in a surface layer of a predetermined portion of the top surface of the semiconductor layer through ion implantation at an acceleration voltage which does not allow the implanted ions to reach the base;

after formation of the first high-resistance region, forming a p-electrode and a low-melting-point metal diffusion prevention layer on the top surface of the semiconductor layer;

bonding the semiconductor device to a conductive support substrate via a low-melting-point metal layer;

removing the base through the laser lift-off process; and forming, in addition to the first high-resistance region, a second high-resistance region in a surface layer of a predetermined portion of the surface of the semiconductor layer which surface has previously bonded to the base, the portion corresponding to the first high-resistance region, through ion implantation at an acceleration voltage which allows the implanted ions to reach the first high-resistance region; and dividing the semiconductor layer, through the first and second high-resistance regions, into semiconductor devices isolated from one another.

In the twenty-first aspect, the p-electrode and low-melting-point metal diffusion prevention layer may be patterned on the top surface of the semiconductor layer serving as semiconductor device regions, or may be formed on the entire top surface of the semiconductor layer without being patterned.

After the steps of the nineteenth or twenty-first aspects, the high-resistance region(s) may be dry-etched, to thereby physically separate the semiconductor layer into device regions, and individual semiconductor devices may be produced through dicing. Alternatively, the semiconductor layer and the base may be directly diced, to thereby produce individual semiconductor devices.

A twenty-second aspect of the present invention is drawn to a specific embodiment of the production method according to any of the thirteenth to twenty-first aspects, wherein the low-melting-point metal layer comprises at least one selected from a group consisting of Au—Sn, Au—Si, Ag—Sn—Cu, and Sn—Bi.

A twenty-third aspect of the present invention is drawn to a specific embodiment of the production method according to any of the thirteenth to twenty-second aspects, wherein the semiconductor device is a Group III nitride semiconductor device.

A twenty-fourth aspect of the present invention is drawn to a specific embodiment of the production method according to any of the thirteenth to twenty-third aspects, wherein the semiconductor device is a light-emitting device.

According to the first to twelfth aspects of the invention, the semiconductor device has a side surface whose surface layer has a high-resistance region formed through ion implantation. Therefore, even though an insulating film of another material is not provided, current leakage or short circuit at the side surface can be prevented.

Particularly in the eighth or ninth aspect, the semiconductor has a top surface provided with a high-resistance region or an insulating film. Therefore, current leakage or short circuit can be also prevented at the top surface.

According to the thirteenth aspect, a side surface whose surface layer has a high-resistance region formed through ion implantation is produced. Therefore, even though an insulating film of another material is not provided, a semiconductor device in which current leakage or short circuit at the side surface is prevented can be produced.

According to the fourteenth aspect, the side surface of the semiconductor device is formed to be inclined. Therefore, ion implantation can be performed along a direction normal to the main plane of the base. Thus, a semiconductor device in which current leakage or short circuit at the side surface is prevented can be produced in a more simple manner.

According to the fifteenth to eighteenth aspects, the top surface of the semiconductor device is provided with a high-resistance region produced through ion implantation or with an insulating film. Therefore, a semiconductor device in which current leakage or short circuit is also prevented at the top surface can be produced.

According to the nineteenth or twenty-first aspect, after formation of p-electrodes, semiconductor devices are physically isolated at centers of high-resistance regions. Therefore, the side surface of each semiconductor device is covered with the high-resistance region at the time of physical isolation, whereby a metal constituting a p-electrode does not deposit on the side surface.

According to the twentieth aspect, ion implantation is performed at a plurality of times at different acceleration voltages. Therefore, the implanted ion concentration becomes uniform in the depth direction, and a high-resistance region having uniformity in the depth direction can be formed.

According to the twenty-first aspect, two-step ion implantation is performed to a first surface and to a second surface, to thereby form a high-resistance region. Thus, acceleration voltage during ion implantation can be reduced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

By reference to the drawings, specific embodiments of the present invention will next be described. However, the present invention is not limited to the embodiments.
Embodiment 1

Figure 1:
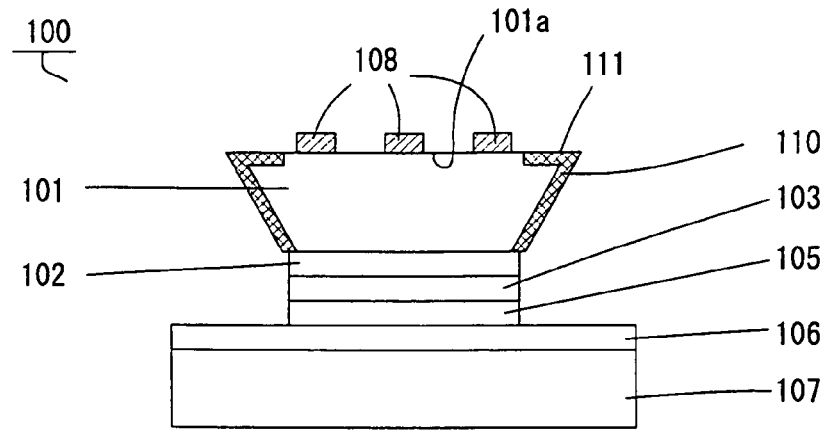
FIG. 1 is a cross-section of a light-emitting device 100 of Embodiment 1.

FIG. 1 is a cross-section of a light-emitting device 100 of Embodiment 1, and FIGS. 2A to 2H show steps of producing the light-emitting device 100 of Embodiment 1.

With reference to FIG. 1, the structure of the light-emitting device 100 will be described. A Group III nitride semiconductor layer 101 is formed into an inverted taper structure in which the cross-sectional area of the device gradually decreases toward a support substrate 107. A p-electrode 102 and a low-melting-point metal diffusion prevention layer 103 are formed on the bottom surface of the semiconductor layer 101. The semiconductor layer is bonded to the support substrate 107 via low-melting-point metal layers 105, 106. On the top surface of the semiconductor layer 101, a lattice-form n-electrode 108 is provided. The semiconductor layer 101 includes a p-layer (p-electrode side), an n-layer (n-electrode side), and an MQW layer provided between the p-layer and the n-layer (these layers are not illustrated). A high-resistance region 110 is formed, through ion implantation, in a surface layer of a side surface of the semiconductor layer 101, and is also formed in a surface layer of the top surface of the semiconductor layer 101 in the vicinity of the side surface. The semiconductor layer 101 has a thickness of 4 μm.

The p-electrode 102 may be formed from a metal having high optical reflectance and low contact resistance; for example, Ag, Rh, Pt, Ru, or an alloy containing such a metal as a primary component. Alternatively, the p-electrode may be made of, for example, Ni, an Ni alloy, or an Au alloy; or may be formed of a composite layer including a transparent electrode film (e.g., ITO film) and a highly reflective metal film. The low-melting-point metal diffusion prevention layer 103 is formed of, for example, a Ti/Ni-containing multi-layer film (e.g., Ti/Ni/Au film), or a W/Pt-containing multi-layer film (e.g., W/Pt/Au film). The low-melting-point metal layers 105, 106 may be formed of a eutectic metal layer (e.g., an Au—Sn layer, an Au—Si layer, an Ag—Sn—Cu layer, or an Sn—Bi layer); or may be made of, for example, a layer of Au, Sn, or Cu (although such a metal is not a low-melting-point metal). The n-electrode 108 is formed from Ti/Al or a similar material. The support substrate 107 may be a conductive substrate formed from, for example, Si, GaAs, Cu, or Cu—W.

The light-emitting device 100 operates such that the top surface of the semiconductor layer 101 (n-electrode 108 side) serves as a light extraction plane 101a. Since high-resistance regions 110, 111 are formed on the semiconductor layer 101, current leakage or short circuit is prevented at the side surface of the semiconductor layer 101 and a region of the top surface in the vicinity of the side surface.

By reference to FIGS. 2A to 2H, steps of producing the light-emitting device 100 will next be described.

Figure 2A:
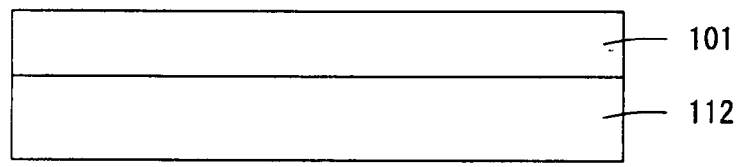
FIGS. 2A to 2H show steps of producing the light-emitting device 100 of Embodiment 1.

Firstly, a semiconductor layer 101 is epitaxially grown on a sapphire base 112 (FIG. 2A). The semiconductor layer 101 includes an n-layer (sapphire base 112 side), an MQW layer on the n-layer, and a p-layer on the MQW layer.

Figure 2B:
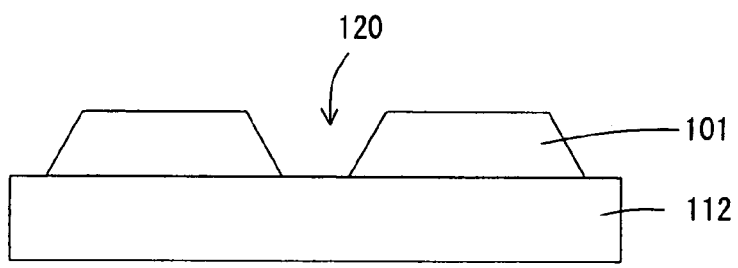

Subsequently, a predetermined region of the semiconductor layer 101 is dry-etched until the sapphire base 112 is exposed, to thereby separate the semiconductor layer 101 into individual devices. Through dry etching, each semiconductor layer portion 101 is formed to be inclined so that the cross-sectional area gradually increases from the p-layer toward the sapphire base 112, to thereby form grooves 120 (FIG. 2B).

Figure 2C:
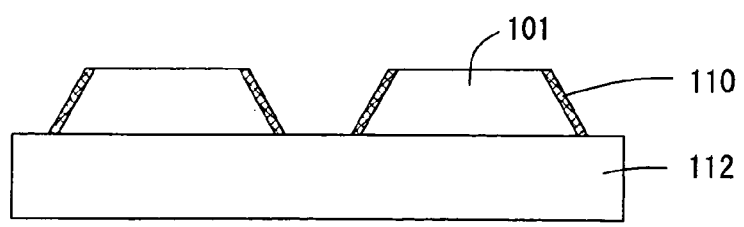

Except for the side surface, the semiconductor layer 101 is covered with a resist film, and nitrogen ions are implanted along the direction normal to the sapphire base 112 to the side surface of the semiconductor layer 101 through the resist film, which serves as a mask. Through bombardment of nitrogen ions with atoms constituting the semiconductor layer 101, the crystal structure of the layer is partially destructed. As a result, a high-resistance region 110 is formed in a surface layer of the side surface of the semiconductor layer 101. Thereafter, the resist film is removed (FIG. 2C).

The semiconductor layer 101 is formed into a tapered structure, since a sample of a non-tapered (vertical) or an inverted tapered structure must be tilted for attaining ion implantation into the side surface, which is cumbersome and not advantageous.

The ion implantation dose is preferably $10^{10}$ to $10^{18}/cm^2$, which corresponds to an excess nitrogen density of $10^{18}$ to $10^{22}/cm^3$. When the dose is in excess of $10^{18}/cm^2$, crystallinity of the semiconductor is excessively impaired, whereas when the dose is lower than $10^{10}/cm^2$, high resistance cannot be attained. Both cases are not preferred. Ion implantation is performed at an acceleration voltage of 120 keV. As a result, the high-resistance region 110 is formed to a layer thickness of 300 nm. The high-resistance region 110 preferably has a thickness of 50 to 1,000 nm. When the thickness is 50 nm or less, the effect of preventing current leakage or short circuit cannot be attained, whereas when the thickness is 1,000 nm or more, a long period of time is required for completing ion implantation.

Other than nitrogen, impurities such as arsenic and phosphorus, which are difficult to electrically activate may be employed as ion species to be implanted.

Figure 2D:
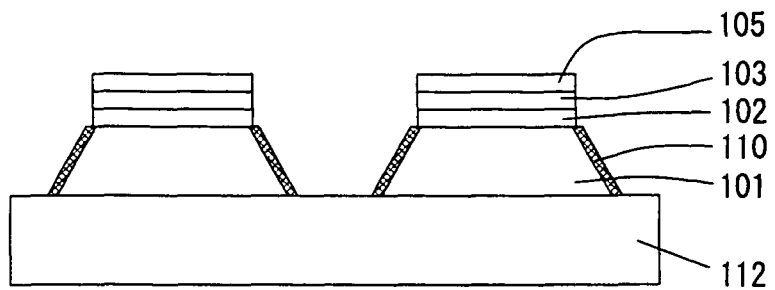

After formation of the high-resistance layer 110, a p-electrode 102 and a low-melting-point metal diffusion prevention layer 103 are formed on the top surface of the semiconductor layer 101, and a low-melting-point metal layer 105 is formed on the low-melting-point metal diffusion prevention layer 103 (FIG. 2D). Since the p-electrode 102, the low-melting-point metal diffusion prevention layer 103, and the low-melting-point metal layer 105 are formed after formation of the high-resistance layer 110, even though metal atoms constituting the electrode and layers are deposited on the side surface of the semiconductor layer 101 during formation thereof, current leakage or short circuit can be prevented.

Figure 2E:
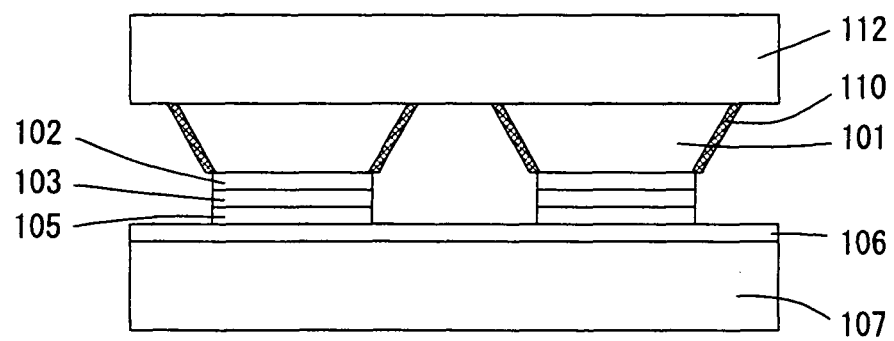

Next, a support substrate 107 is bonded to the low-melting-point metal layer 105 via a low-melting-point metal layer 106, which is formed on the top surface of the support substrate 107 (FIG. 2E). The low-melting-point metal diffusion prevention layer 103 is provided for preventing diffusion therethrough of a metal constituting the low-melting-point metal layers 105, 106 to the p-electrode 102.

Figure 2F:
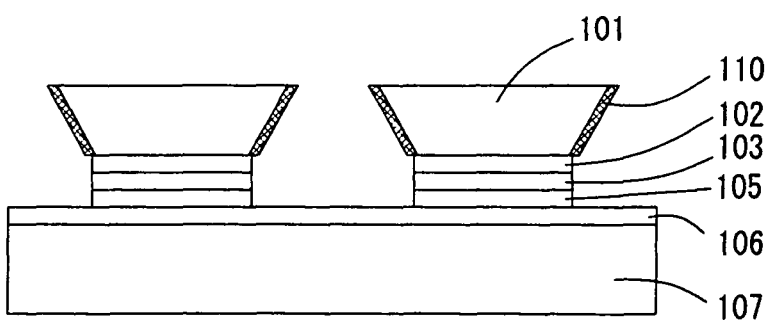

Through the laser lift-off technique, the sapphire base 112 is irradiated with a laser beam, to thereby remove the sapphire base 112 (FIG. 2F).

Figure 2G:
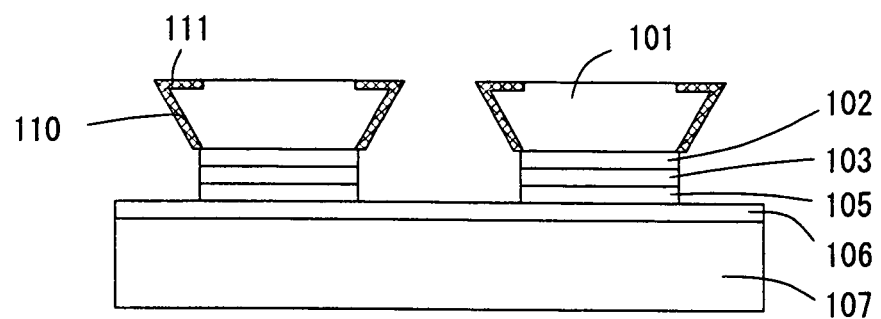

Subsequently, ion implantation is performed to a portion of the surface of the semiconductor layer 101 which surface has previously bonded to the sapphire base 112 (light extraction surface 101a) and which is in the vicinity of the side surface (i.e., extending from the side surface to the inside and having a width 5% to 10% the width of the top surface), whereby a high-resistance region 111 is formed (FIG. 2G). The high-resistance region 111 may be formed not only in the vicinity of the side surface but also in a surface layer of the region other than an n-electrode 108 formed in a subsequent step. The high-resistance region 111, in which crystallinity is impaired, does not inhibit light emission.

Figure 2H:
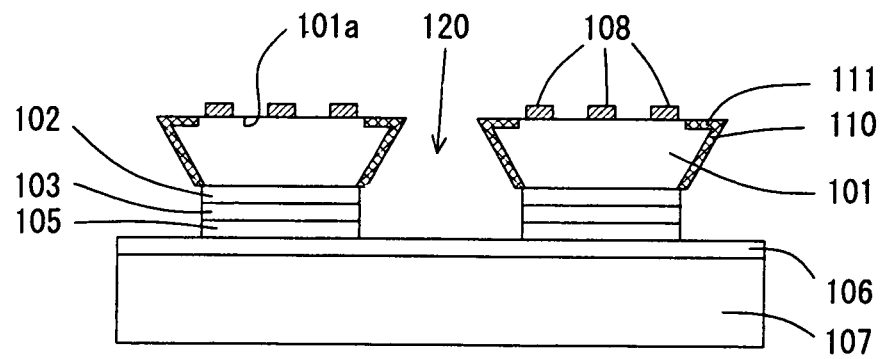

On the light extraction surface 101a, a lattice-form n-electrode 108 is formed (FIG. 2H). Through dicing along a groove 120 of the support substrate 107, the light-emitting device 100 shown in FIG. 1 is produced. In the dicing step, metal powder is generated during the course of cutting the low-melting-point metal layer 106. In some cases, metal powder is deposited on a side surface or a portion of the light extraction surface 101a in the vicinity of the side surface in the light-emitting device 100. Also, when the low-melting-point metal layer 106 is melted, the melt may cover a portion of the light extraction surface 101a in the vicinity of the side surface. Even in such cases, current leakage or short circuit is prevented by virtue of the formed high-resistance regions 110, 111.

Embodiment 2

Figure 3:
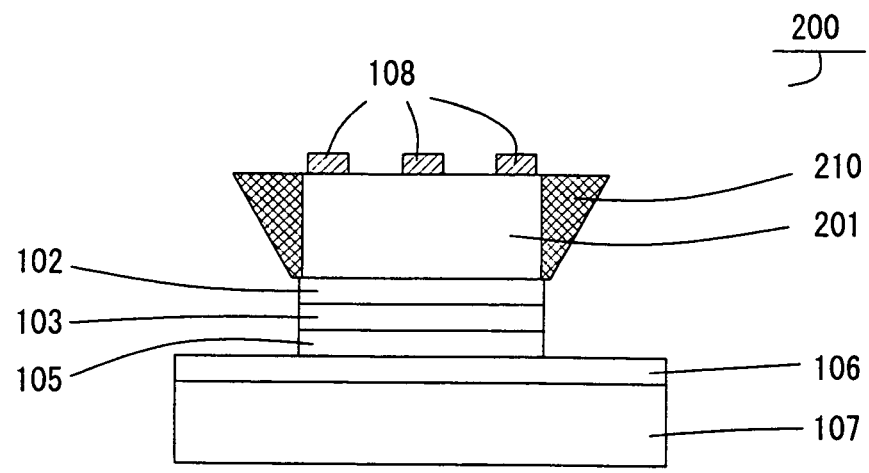
FIG. 3 is a cross-section of a light-emitting device 200 of Embodiment 2.

FIG. 3 is a cross-section of a light-emitting device 200 of Embodiment 2. The structure of the light-emitting device 200 is the same as that of the light-emitting device 100 of Embodiment 1, except that a high-resistance region 210 is provided in the entire side wall of a semiconductor layer 201 as an inverted tapered region. Similar to the light-emitting device 100, current leakage or short circuit is prevented by the high-resistance region 210.

Figure 4:
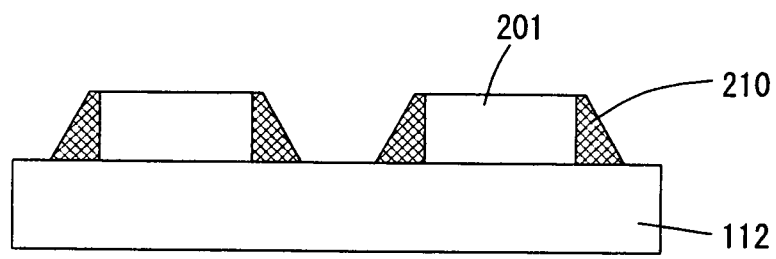
FIGS. 4A and 4B show a part of the steps of producing the light-emitting device 200 of Embodiment 2.
Figure 4:
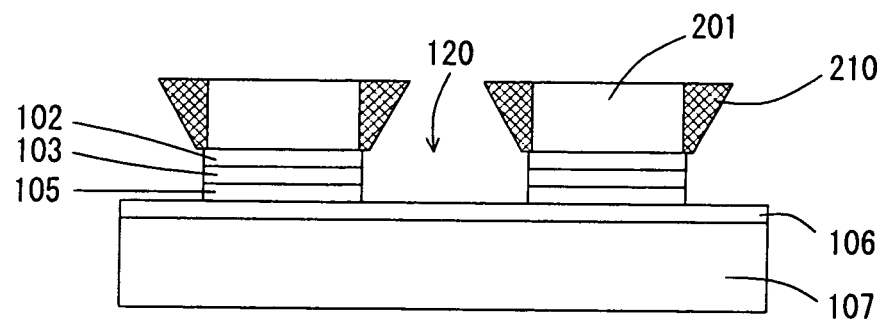

Next, steps of producing the light-emitting device 200 will be described. The steps of producing the light-emitting device 200 are the same as those of producing the light-emitting device 100, except that the step shown in FIG. 2C is varied. In Embodiment 1, ion implantation is performed at an acceleration voltage of 120 keV, whereas in Embodiment 2, an acceleration voltage of 1.2 MeV is employed. Through ion implantation, a high-resistance region 210 having a thickness of 4 µm (the same thickness as that of the semiconductor layer 201) can be formed (FIG. 4A). Ion implantation may be performed at a plurality of times at different acceleration voltages, since ion concentration uniformity in the thickness direction of the semiconductor layer 201 is difficult to attain through a single ion implantation step. When ion implantation is performed at a plurality of times at different acceleration voltages, the semiconductor layer 201 has ion concentration uniformity in the thickness direction.

Similar to Embodiment 1, a p-electrode 102, a low-melting-point metal diffusion prevention layer 103, and a low-melting-point metal layer 105 are formed, a support substrate 107 is bonded to a low-melting-point metal layer 105 via a low-melting-point metal layer 106, and a sapphire base 112 is removed through the laser lift-off technique (FIG. 4B). Since the high-resistance region 210 is provided in the entire inverted tapered region, a portion of the surface layer of the surface of the semiconductor layer 202 which surface has previously bonded to the sapphire base 112 in the vicinity of the side surface is formed of a high-resistance region. Thus, the step shown in FIG. 2G (Embodiment 1) may be omitted. That is, the process that a high-resistance region is formed on the top surface in the vicinity of the side surface can be omitted. Thereafter, in a manner similar to that of Embodiment 1, a lattice-form n-electrode 108 is formed, and the light-emitting device 200 shown in FIG. 3 is produced through dicing along a groove 120 of the support substrate 107.

The acceleration voltage during ion implantation is 120 keV in Embodiment 1 and 1.2 MeV in Embodiment 2. However, the acceleration voltage is not limited to these values. When ion implantation is performed at an acceleration voltage which does not allow the implanted ions to reach the sapphire base 112, ion implantation is performed in a manner of Embodiment 1, whereas when ion implantation is performed at an acceleration voltage which allows the implanted ions to reach the sapphire base 112, ion implantation is performed in a manner of Embodiment 2.

$77

Embodiment 3

Figure 5:
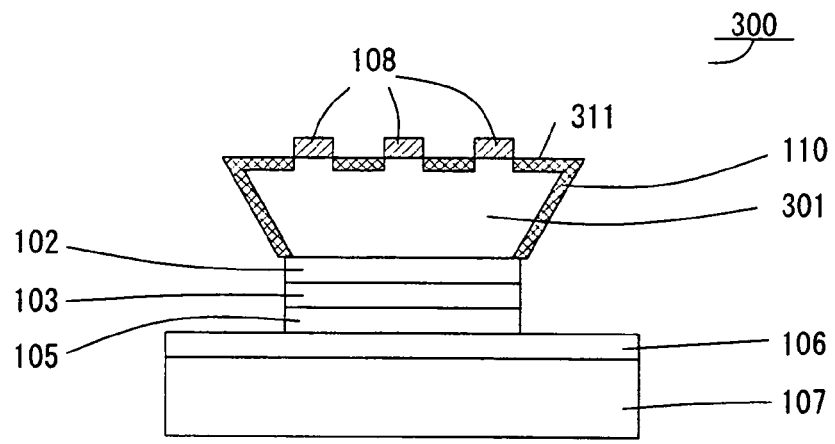
FIG. 5 is a cross-section of a light-emitting device 300 of Embodiment 3.

FIG. 5 is a cross-section of a light-emitting device 300 of Embodiment 3. The structure of the light-emitting device 300 is the same as that of the light-emitting device 100 of Embodiment 1, except that a high-resistance layer 311 is formed in a portion of a surface layer of the top surface of a semiconductor layer 301, other than the area where an n-electrode 108 is formed. By virtue of the high-resistance layer 311, current leakage or short circuit is prevented at the top surface of the semiconductor layer 301.

Figure 6A:
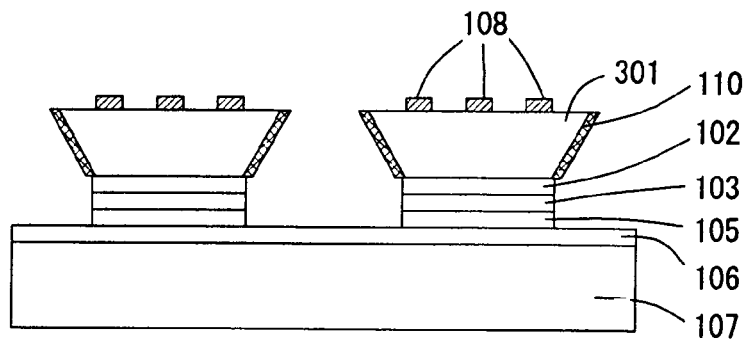
FIGS. 6A and 6B show a part of the steps of producing the light-emitting device 300 of Embodiment 3.
Figure 6B:
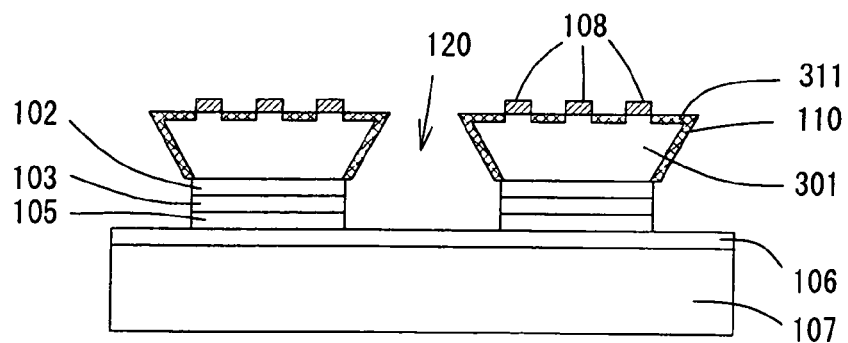

Steps of producing the light-emitting device 300 will be described. The steps of producing the light-emitting device 300 are the same as those of producing the light-emitting device 100 of Embodiment 1, except that the steps shown in FIGS. 2G and 2H are varied. After the step shown in FIG. 2F, the lattice-form n-electrode 108 is formed on a surface of the semiconductor layer 301 which surface has previously bonded to the sapphire base 112 (FIG. 6A). Subsequently, ion implantation is performed through the n-electrode 108 serving as a mask under the same conditions as employed in Embodiment 1, to thereby form the high-resistance region 311 (FIG. 6B). Thereafter, through dicing along a groove 120 of the support substrate 107, the light-emitting device 300 is produced. Notably, since the high-resistance region 311 is provided so as to disturb the crystal structure of the semiconductor layer, the region is transparent with respect to the emitted light.

Embodiment 4

Figure 7:
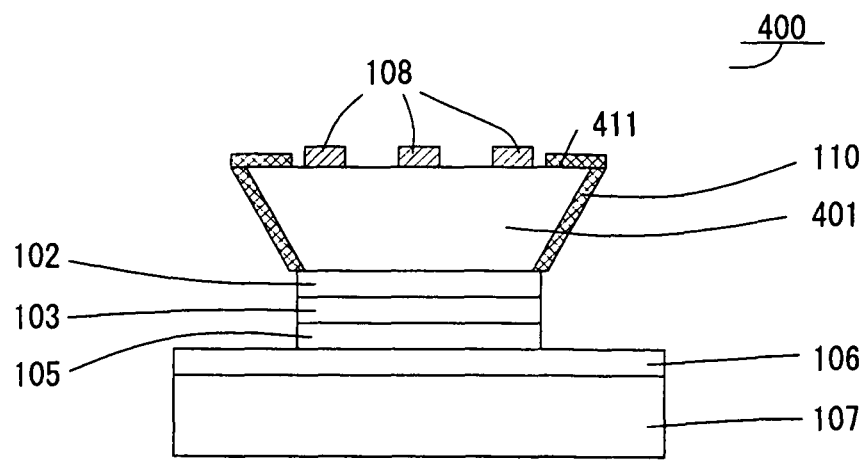
FIG. 7 is a cross-section of a light-emitting device 400 of Embodiment 4.

FIG. 7 is a cross-section of a light-emitting device 400 of Embodiment 4. The structure of the light-emitting device 400 is the same as that of the light-emitting device 100 of Embodiment 1, except that an $SiO_2$ insulating film 411 is formed on a semiconductor layer 401, instead of the high-resistance layer 111 formed through ion implantation. The insulating film 411 is formed on a portion of the top surface of the semiconductor layer 401 extending from the side surface to the inside and having a width 5% to 10% the width of the top surface. By changing the ion implantation step (FIG. 2G) in the steps of producing the light-emitting device 100 of Embodiment 1 to the step of forming the insulating film through CVD, the light-emitting device 400 is produced.

Similar to the high-resistance region 111 of the light-emitting device 100, current leakage or a similar phenomenon at a portion of the top surface of the semiconductor layer 401 in the vicinity of the side surface is prevented by virtue of the insulating film 411.

Other than $SiO_2$, the insulating film 411 may be formed from, for example, $Si_3N_4$, $ZrO_2$, $NbO$, or $Al_2O_3$.

Embodiment 5

Figure 8:
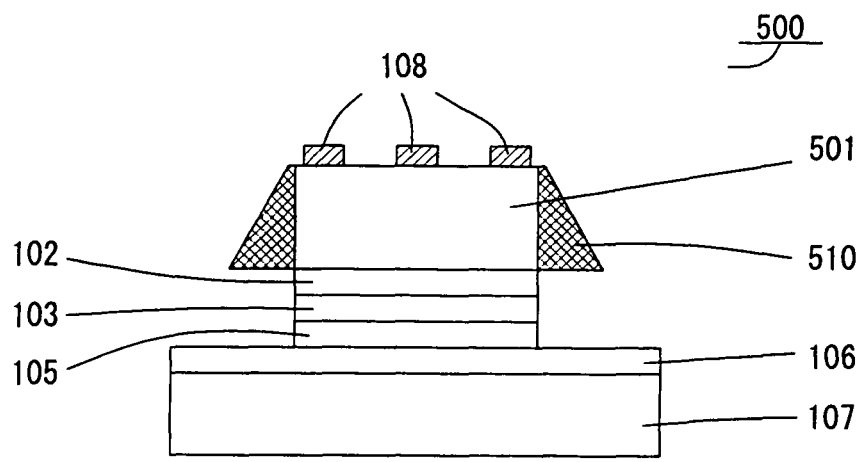
FIG. 8 is a cross-section of a light-emitting device 500 of Embodiment 5.

FIG. 8 is a cross-section of a light-emitting device 500 of Embodiment 5. The structure of the light-emitting device 500 is the same as that of the light-emitting device 100 of Embodiment 1, except that a high-resistance region 510 is provided with an inverted tapered figure, of which a cross-sectional area is gradually increasing toward the support substrate 107, in the entire side wall of a semiconductor layer 501 as an inverted tapered region. in the entire inverted tapered region of a semiconductor layer 501.

By reference to FIGS. 9A to 9F, steps of producing the light-emitting device 500 will next be described.

Figure 9A:
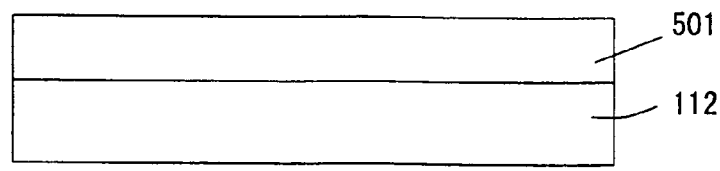
FIGS. 9A to 9F show steps of producing the light-emitting device 500 of Embodiment 5.

Firstly, in a manner similar to that of Embodiment 1, the semiconductor layer 501 is epitaxially grown on a sapphire base 112 (FIG. 9A).

Figure 9B:
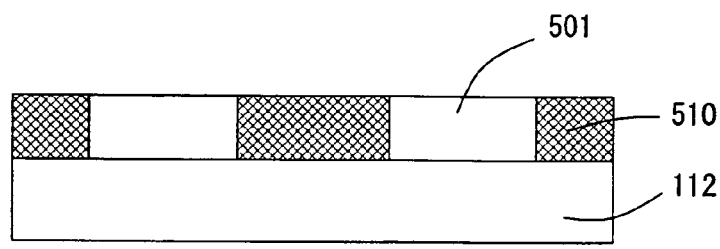

Subsequently, a resist film is formed on a predetermined region of the semiconductor layer 501, and nitrogen ions are implanted along the direction normal to the sapphire base 112 through the resist film, which serves as a mask, to thereby form the high-resistance region 510. Thereafter, the resist film is removed (FIG. 9B). Actually, ion implantation is performed three times at different acceleration voltages so as to attain an implanted ion concentration which is uniform in the thickness direction (from the top surface of the semiconductor layer 501 to the sapphire base 112). Thus, the semiconductor layer 501 is separated by the high-resistance region 510, to thereby isolate individual device regions.

Figure 9C:
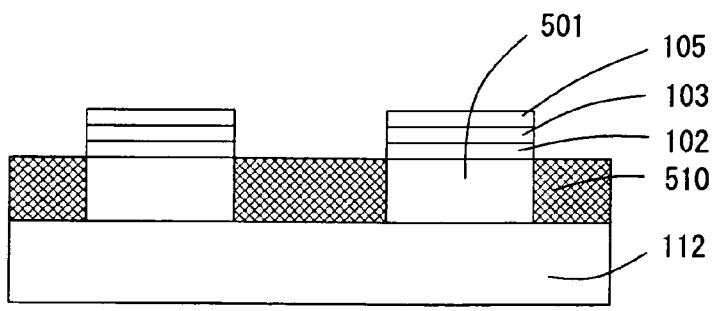

On a portion of the semiconductor layer 501 other than the high-resistance region 510, a p-electrode 102 and a low-melting-point metal diffusion prevention layer 103 are formed through the lift-off process. A low-melting-point metal layer 105 is formed on the low-melting-point metal diffusion prevention layer 103 (FIG. 9C). Since the p-electrode 102, the low-melting-point metal diffusion prevention layer 103, and the low-melting-point metal layer 105 are formed after formation of the high-resistance layer 510, even though metal atoms constituting the electrode and layers are deposited on the side surface of the semiconductor layer 501 during formation thereof, current leakage or short circuit can be prevented.

Figure 9D:
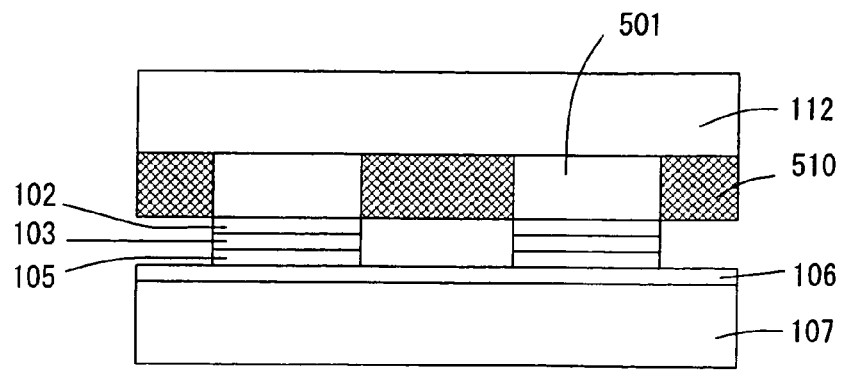

Next, the support substrate 107 is bonded to the low-melting-point metal layer 105 via a low-melting-point metal layer 106, which is formed on the top surface of the support substrate 107 (FIG. 9D).

Figure 9E:
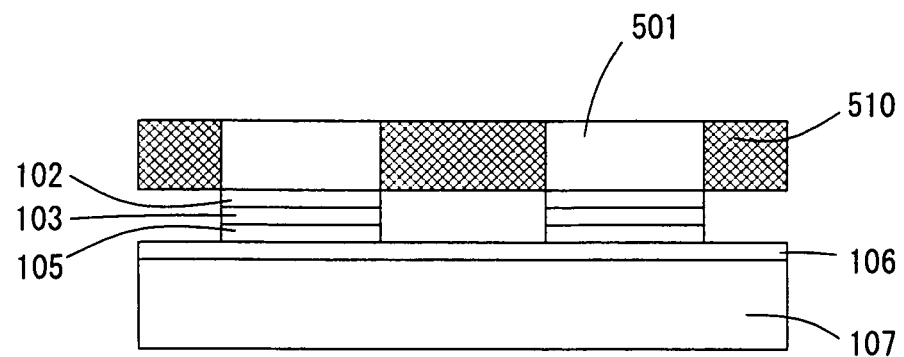

The sapphire base 112 is removed through the laser lift-off technique (FIG. 9E).

Figure 9F:
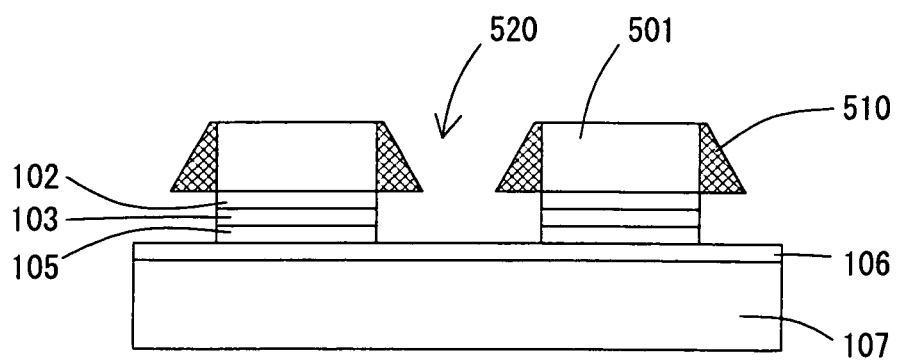

Subsequently, the high-resistance region 510 is dry-etched into a tapered structure in which the device has a cross-sectional area gradually increasing toward the support substrate 107, to thereby form a groove 520 and physically separate the semiconductor layer into device regions (FIG. 9F). By virtue of the tapered structure, the light extraction efficiency of the light-emitting device 500 can be increased.

Then, a n-electrode 108 is patterned into a lattice form, and the light-emitting device 500 shown in FIG. 8 is produced through dicing along the groove 520 of the support substrate 107.

Embodiment 6

Figure 10:
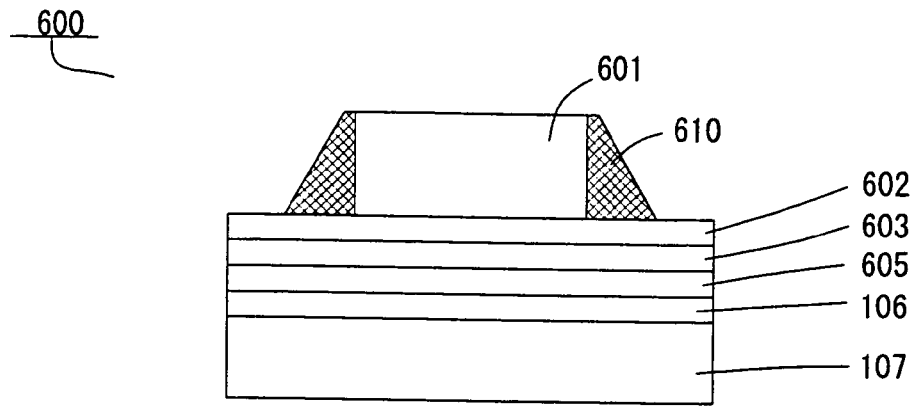
FIG. 10 is a cross-section of a light-emitting device 600 of Embodiment 6.
Figure 11:
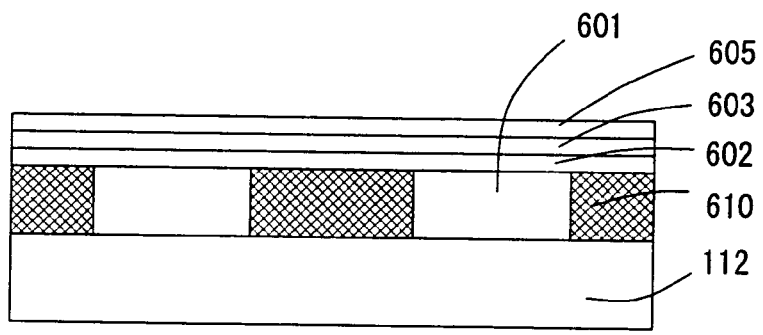
FIG. 11 shows a part of the steps of producing the light-emitting device 600 of Embodiment 6.

FIG. 10 is a cross-section of a light-emitting device 600 of Embodiment 6. The structure of the light-emitting device 600 is the same as that of the light-emitting device 500 of Embodiment 5, except that a p-electrode 602, a low-melting-point metal diffusion prevention layer 603, and a low-melting-point metal layer 605 are formed on the entire top surface of a support substrate 107 without being patterned. The steps of producing the light-emitting device 600 are the same as those of producing the light-emitting device 500 of Embodiment 5, except that the step shown in FIG. 9C is varied. As shown in FIG. 11, in the production of the device of Embodiment 6, the p-electrode 602, low-melting-point metal diffusion prevention layer 603, and low-melting-point metal layer 605 are formed on the entire top surface of the semiconductor layer 601 and of the high-resistance region 610 and have not been patterned (FIG. 11). Thereafter, the high-resistance region 610 is dry-etched to be inclined so as to form a tapered structure in a manner similar to that of Embodiment 5, to thereby form a groove 520, and an n-electrode 108 is patterned to a lattice form. Through cutting the support substrate 107 together with the p-electrode 602, low-melting-point metal diffusion prevention layer 603, and low-melting-point metal layer 605, the light-emitting device 600 shown in FIG. 10 is produced.

Embodiment 7

Figure 12:
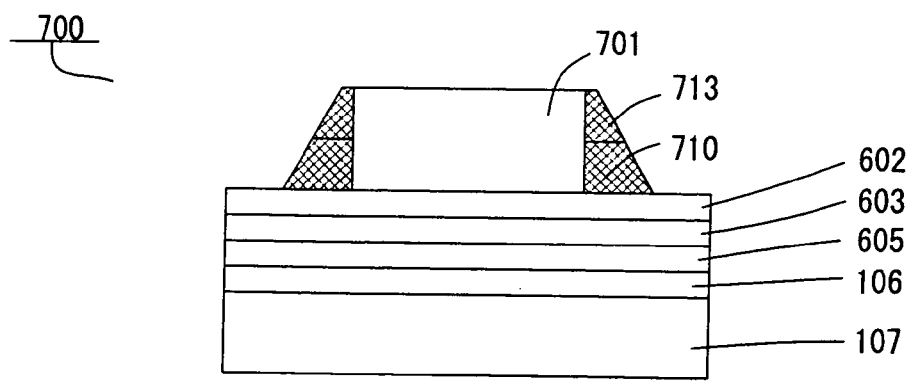
FIG. 12 is a cross-section of a light-emitting device 700 of Embodiment 7.

FIG. 12 is a cross-section of a light-emitting device 700 of Embodiment 7. The structure of the light-emitting device 700 is the same as that of the light-emitting device 600 of Embodiment 6, except that a dual-layer high-resistance region including high-resistance regions 710, 713 is formed instead of the high-resistance region 610.

By reference to FIGS. 13A to 13F, steps of producing the light-emitting device 700 will next be described.

Figure 13A:
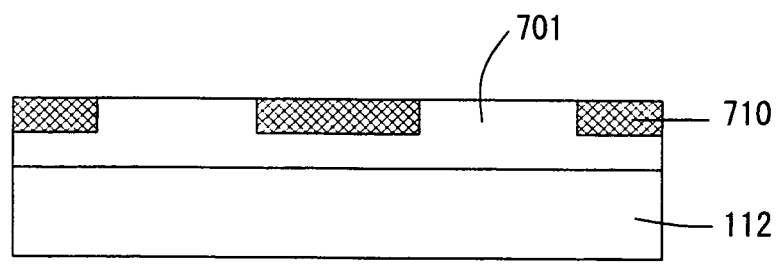
FIGS. 13A to 13F show steps of producing the light-emitting device 700 of Embodiment 7.

Firstly, similar to Embodiment 1, a semiconductor layer 701 is epitaxially grown on a sapphire base 112. Similar to the step of Embodiment 5 shown in FIG. 9B, a resist film is formed on a predetermined region of the semiconductor layer 701, and nitrogen ions are implanted along the direction normal to the sapphire base 112 through the resist film, which serves as a mask, to thereby form the high-resistance region 710 (i.e., first high-resistance region) having a thickness (2 µm) of about half that of the semiconductor layer 701. Thereafter, the resist film is removed (FIG. 13A). The step differs from the step shown in FIG. 9B in that ion implantation is performed once at such an acceleration voltage that allows the implanted nitrogen ions to reach the half depth of the semiconductor layer 701.

Figure 13B:
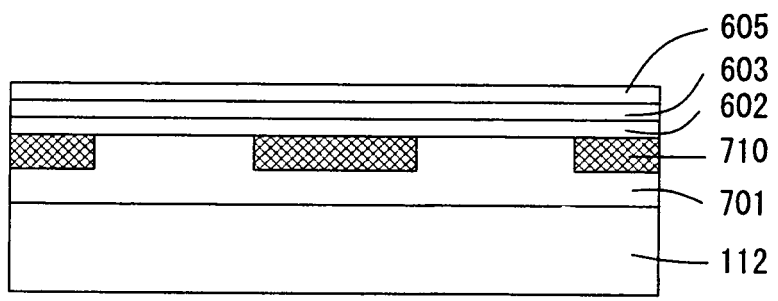
Figure 13C:
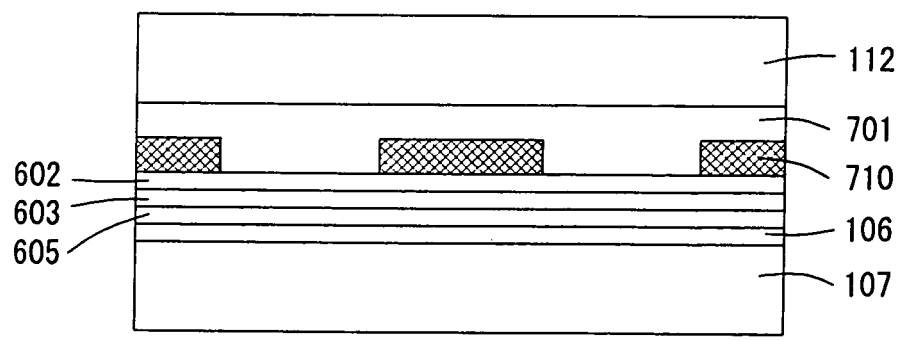
Figure 13D:
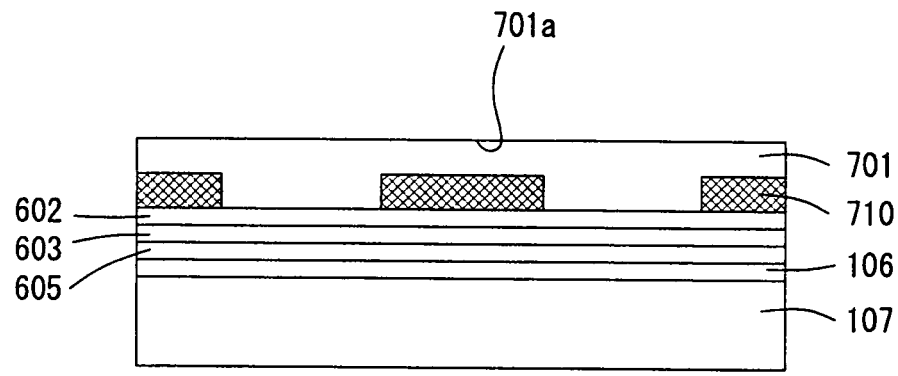

Subsequently, similar to a production step of Embodiment 6, a p-electrode 602, a low-melting-point metal diffusion prevention layer 603, and a low-melting-point metal layer 605 are formed on the entire top surface of a support substrate 107 (FIG. 13B). The support substrate 107 is bonded to the low-melting-point metal layer 605 via a low-melting-point metal layer 106, which is formed on the top surface of the support substrate 107 (FIG. 13C). The sapphire substrate 112 is removed through the laser lift-off technique (FIG. 13D).

Figure 13E:
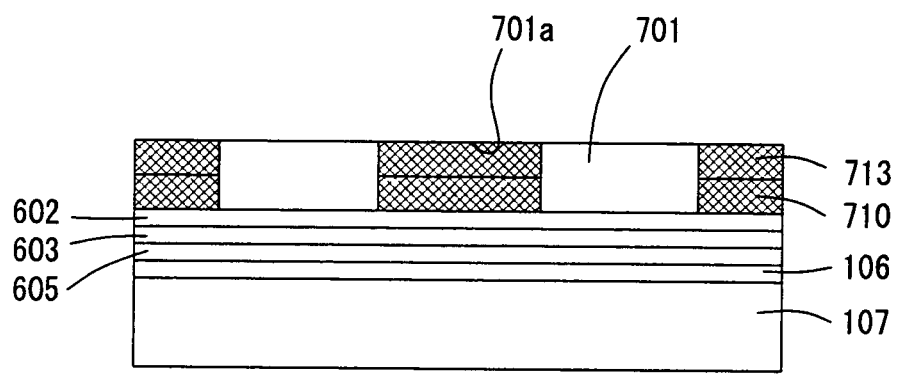

Subsequently, ion implantation is performed once to a portion of the surface 701a of the semiconductor layer 701 which surface has previously bonded to the sapphire base 112, the portion being opposite the high-resistance region 710, at such an acceleration voltage that allows the implanted nitrogen ions to reach the high-resistance region 710. Similar to the aforementioned cases, the region to which ions are not implanted is covered with a resist film serving as a mask, and the resist film is removed after ion implantation. Through ion implantation, the high-resistance region 713 is formed. The semiconductor layer 701 is separated by the high-resistance regions 710, 713, to thereby isolate individual device regions (FIG. 13E).

An advantage of the aforementioned two-step ion implantation resides in that no such a high acceleration voltage that allows the implanted ions to reach the sapphire base 112 is required (Embodiments 2, 5, and 6). Briefly, the minimum required acceleration voltage can be reduced. When single-step ion implantation is performed to a layer having a thickness of 4 µm, an acceleration voltage of 1.2 MeV is required to cause nitrogen ions to reach the sapphire base 112. However, when two-step ion implantation of Embodiment 7 is performed, the acceleration voltage may be such a value that allows nitrogen ions to reach the half depth of the semiconductor layer. Specifically, when the layer thickness is 4 µm, the required acceleration voltage is 800 keV. Thereafter, the high-resistance regions 710, 713 are dry-etched to be inclined so as to form a tapered structure in which the device has a cross-sectional area gradually increasing toward the support substrate 107, to thereby form a groove 720, whereby the semiconductor layer is physically separated into individual device regions (FIG. 13F).

Thereafter, an n-electrode 108 is patterned to a lattice form. Through cutting along the groove 720 of the support substrate 107 together with the p-electrode 602, low-melting-point metal diffusion prevention layer 603, low-melting-point metal layer 605, and a low-melting-point metal layer 106, the light-emitting device 700 shown in FIG. 12 is produced.

The two-step ion implantation technique for reducing the required acceleration voltage performed in Embodiment 7 may be applied to Embodiment 5.

Figure 13F:
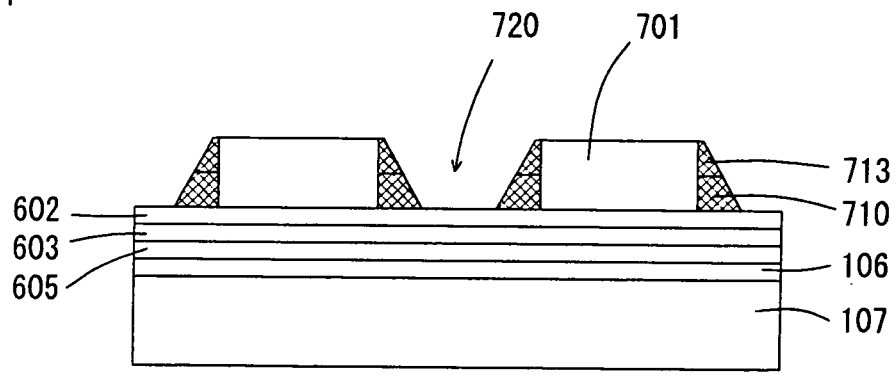

In Embodiments 5 to 7, a high-resistance region is dry-etched to physically separate the region as shown in FIG. 9F or 13F. However, such dry-etching is not necessarily required, and the high-resistance region may be directly cut through dicing.

In Embodiments 5 to 7, a p-electrode, a low-melting-point metal diffusion prevention layer, and a low-melting-point metal layer are formed before physical device isolation. Therefore, a metal constituting the electrode or the layers is not deposited on a side surface of the semiconductor device during formation of the electrode and the layers.

The above Embodiments are given for producing light-emitting devices. However, the present invention is not limited to a light-emitting device and encompasses any semiconductor devices which are produced through the laser lift-off technique. The invention is not limited to a Group III nitride semiconductor device and is applicable to Group III-V semiconductor (e.g., GaAs or GaP) devices. No particular limitation is imposed on the shape of the n-electrode, and any shape such as lattice or stripe may be employed, so long as light extraction through the top surface is not inhibited.

In the above Embodiments, the support substrate is bonded to the semiconductor structure. However, the support substrate may be formed through directly plating a semiconductor layer with a metal such as Cu.

As described hereinabove, a semiconductor device in which current leakage or short circuit is prevented at a side surface of the device can be produced.

What is claimed is:

1. A method for producing a Group III-V semiconductor device, the method comprising:
    forming, on a base, a plurality of semiconductor devices isolated from one another;
    forming, through an ion implantation, a high-resistance region in a surface layer of a side surface of each semiconductor device;
    after the forming of the high-resistance region, forming a p-electrode and a low-melting-point metal diffusion prevention layer on a top surface of the semiconductor device;
    bonding the semiconductor device to a conductive support substrate via a low-melting-point metal layer comprising at least one selected from a group consisting of Au—Sn, Au—Si, Ag—Sn—Cu, and Sn—Bi; and
    removing the base through a laser lift-off process,
    wherein the side surface of the semiconductor device is formed to be inclined so that the device has a cross-sectional area gradually increasing toward the base, and the ion implantation is performed along a direction normal to a main plane of the base.

2. The method of claim 1, further comprising:
    after said removing the base, performing the ion implantation into a portion of the semiconductor device from a surface which has previously bonded to the base, the portion being in a vicinity of the side surface.

3. The method of claim 1, further comprising:
    after said removing the base, forming a dielectric material insulating film on a portion of a surface of the semiconductor device which has previously bonded to the base, the portion being in a vicinity of the side surface.

4. A method for producing a Group III-V semiconductor device, the method comprising:
    forming, on a base, a plurality of semiconductor devices isolated from one another;
    forming, through an ion implantation, a high-resistance region in a surface layer of a side surface of each semiconductor device;
    after the forming of the high-resistance region, forming a p-electrode and a low-melting-point metal diffusion prevention layer on a top surface of the semiconductor device;
    bonding the semiconductor device to a conductive support substrate via a low-melting-point metal layer; and
    removing the base through a laser lift-off process,
    wherein the side surface of the semiconductor device is formed to be inclined so that the device has a cross-sectional area gradually increasing toward the base, and ion implantation is performed along a direction normal to the main plane of the base,
    wherein the ion implantation is performed at an acceleration voltage which allows implanted ions to reach the base so that a width of the high-resistance region increases toward the base, the width being in a direction parallel to the base.

5. The method of claim 4, wherein the low-melting-point metal layer comprises at least one selected from a group consisting of Au—Sn, Au—Si, Ag—Sn—Cu, and Sn—Bi.

6. The method of claim 4, wherein the width of the high-resistance region continuously increases as the high-resistance region extends from an upper surface of the high-resistance region to the base.

7. The method of claim 4, wherein a cross-sectional shape of the high-resistance region, extending perpendicular to the base, comprises a right-angled triangle.

8. A method for producing a Group III-V semiconductor device, the method comprising:
forming, on a base, a plurality of semiconductor devices isolated from one another;
forming, through an ion implantation, a high-resistance region in a surface layer of a side surface of each semiconductor device;
after the faulting of the high-resistance region, forming a p-electrode and a low-melting-point metal diffusion prevention layer on a top surface of the semiconductor device;
bonding the semiconductor device to a conductive support substrate via a low-melting-point metal layer;
removing the base through a laser lift-off process; and
after said removing the base, fowling an n-electrode on a surface of the semiconductor device which has previously bonded to the base, and performing the ion implantation into the surface of the semiconductor device through the n-electrode, which serves as a mask.

9. A method for producing a Group III-V semiconductor device, the method comprising:
forming a Group III-V semiconductor layer on a base;
forming a high-resistance region in a predetermined portion of the semiconductor layer through an ion implantation from a top surface thereof at an acceleration voltage which allows implanted ions to reach the base to isolate the semiconductor layer, through the high-resistance region, into semiconductor device regions isolated from one another;
after the forming of the high-resistance region, forming a p-electrode and a low-melting-point metal diffusion prevention layer on the top surface of at least the semiconductor device regions;
bonding the semiconductor device regions to a conductive support substrate via a low-melting-point metal layer; and
removing the base through a laser lift-off process.

10. A semiconductor device production method as described in claim 9, wherein the semiconductor device comprises a Group III nitride semiconductor device.

11. A semiconductor device production method as described in claim 9, wherein the semiconductor device comprises a light-emitting device.

12. A semiconductor device production method as described in claim 9, wherein after said removing the base, a portion of the high-resistance region between adjacent semiconductor device regions is etched and the conductive support substrate is cut in an etched portion to obtain individual semiconductor devices.

13. A semiconductor device production method as described in claim 9, wherein the p-electrode and the low-melting-point metal diffusion prevention layer are formed on an entirety of the top surface of the semiconductor layer.

14. A semiconductor device production method as described in claim 9, wherein the low-melting-point metal layer comprises at least one selected from a group consisting of Au—Sn, Au—Si, Ag—Sn—Cu, and Sn—Bi.

15. A method for producing a Group III-V semiconductor device, the method comprising:
forming, on a base, a plurality of semiconductor devices isolated from one another;
forming, through an ion implantation, a high-resistance region in a surface layer of a side surface of each semiconductor device;
after the forming of the high-resistance region, forming a p-electrode and a low-melting-point metal diffusion prevention layer on a top surface of the semiconductor device;
bonding the semiconductor device to a conductive support substrate via a low-melting-point metal layer; and
removing the base through a laser lift-off process,
wherein the side surface of the semiconductor device is formed to be inclined so that the device has a cross-sectional area gradually increasing toward the base, and ion implantation is performed along a direction normal to the main plane of the base, and
wherein the ion implantation is performed at an acceleration voltage which allows implanted ions to reach the base and the ion implantation is performed at a plurality of times at different acceleration voltages.

16. A method for producing a Group III-V semiconductor device, the method comprising:
forming a Group III-V semiconductor layer on a base;
forming a first high-resistance region in a predetermined portion of the semiconductor layer through an ion implantation from a top surface thereof at an acceleration voltage which does not allow implanted ions to reach the base;
after the forming of the first high-resistance region, forming a p-electrode and a low-melting-point metal diffusion prevention layer on the top surface of the semiconductor layer;
bonding the semiconductor device to a conductive support substrate via a low-melting-point metal layer;
removing the base through a laser lift-off process; and
forming, in addition to the first high-resistance region, a second high-resistance region in the predetermined portion of the semiconductor layer from a surface which has previously bonded to the base, the portion corresponding to the first high-resistance region, through an ion implantation at an acceleration voltage which allows implanted ions to reach the first high-resistance region to isolate the semiconductor layer, through the first and second high-resistance regions, into semiconductor device regions isolated from one another.

17. A semiconductor device production method as described in claim 16, wherein after said removing the base, a portion of the first and second high-resistance regions between adjacent semiconductor device regions is etched and the conductive support substrate is cut in an etched portion to obtain individual semiconductor devices.

18. A semiconductor device production method as described in claim 16, wherein the p-electrode and the low-melting-point metal diffusion prevention layer are formed on an entirety of the top surface of the semiconductor layer.

19. A semiconductor device production method as described in claim 16, wherein the low-melting-point metal layer comprises at least one selected from a group consisting of Au—Sn, Au—Si, Ag—Sn—Cu, and Sn—Bi.

\* \* \* \* \*

UNITED STATES PATENT AND TRADEMARK OFFICE
CERTIFICATE OF CORRECTION

PATENT NO. : 8,420,502 B2
APPLICATION NO. : 12/656970
DATED : April 16, 2013
INVENTOR(S) : Masanobu Ando et al.

It is certified that error appears in the above-identified patent and that said Letters Patent is hereby corrected as shown below:

In the Claims:

Column 15, Claim 8, line 8, change "faulting" to "forming".

Column 15, Claim 8, line 15, change "fowling" to "forming".

Signed and Sealed this
Second Day of July, 2013

Teresa Stanek Rea
*Acting Director of the United States Patent and Trademark Office*